United States Patent [19]

Arai et al.

[11] Patent Number: 4,751,611
[45] Date of Patent: Jun. 14, 1988

[54] SEMICONDUCTOR PACKAGE STRUCTURE

[75] Inventors: Toshiyuki Arai, Tochigi; Keiji Hazama, Oyama; Shin'ichi Ota, Shimodate, all of Japan

[73] Assignee: Hitachi Chemical Co., Ltd., Japan

[21] Appl. No.: 888,866

[22] Filed: Jul. 24, 1986

[51] Int. Cl.⁴ ............................................. H05K 5/02
[52] U.S. Cl. .................................. 361/421; 361/388; 174/52 FP
[58] Field of Search ............... 361/421, 385, 386, 387; 174/52 FP; 357/72, 74

[56] References Cited

U.S. PATENT DOCUMENTS

| | | | |
|---|---|---|---|
| 3,930,114 | 12/1975 | Hodge | 174/52 FP |
| 4,369,330 | 1/1983 | Pilz | 174/52 FP |
| 4,393,581 | 7/1983 | Cherian | 29/827 X |
| 4,486,945 | 12/1984 | Aigoo | 174/52 FP X |

OTHER PUBLICATIONS

IBM Tech Disc. Bull, vol. 15, No. 1, Jun. 1972, p. 307, DeBoskey, "Directly Attached Integrated Circuit Lead Frame".
IBM Tech Disc Bull, vol. 9, No. 11, Apr. 1967, p. 1511, Betz et al., "Monolitich Chip Carrier".

Primary Examiner—A. D. Pellinen
Assistant Examiner—Jeffrey A. Gaffin
Attorney, Agent, or Firm—Antonelli, Terry & Wands

[57] ABSTRACT

A semiconductor package comprising a pair of flat moldings made from a thermoplastic resin, one of the flat moldings having in the cavity a projection which is welded to a rear side of a tab of lead frame mounting a semiconductor thereon by melt heating, is excellent in heat dissipation and reliability and provides no deformation nor cutting of wires connecting the semiconductor and lead frames.

3 Claims, 1 Drawing Sheet

SEMICONDUCTOR PACKAGE STRUCTURE

BACKGROUND OF THE INVENTION

This invention relates to a package structure made from a thermoplastic resin and having a cavity to hold semiconductor elements such as diodes, transistors, etc, or integrated circuits of these semiconductors (hereinafter referred to as "a semiconductor") airtightly.

As packaging methods for semiconductors, there is mainly used a plastic package method wherein lead frames previously mounting a semiconductor are placed between top and bottom molds and a molten resin is poured into a cavity formed by these molds. But according to this method, since the semiconductor is forced to be placed in a high pressure and high temperature state due to a direct contact with the molten resin, there sometimes takes place cutting of wires connecting lead terminals and electrodes of the semiconductor.

In order to improve such a defect of the plastic package method, there is proposed a method wherein lead frames mounting a semiconductor are inserted between a pair of resin moldings having a cavity therein and integrally joined (Japanese Patent Unexamined Publication No. 98969/76). But even in this method, since the semiconductor is in a state of hanging in a closed space, there are problems in that the dissipation of heat from the semiconductor is difficult at the time of operation, thermal resistance becomes larger particularly in the case of semiconductor with higher integration capacity. Further, since a tab of lead frame for fixing the semiconductor is only supported by two tab hanger 9 as shown in FIG. 3 in usual, wires which connect electrodes of semiconductors and lead terminals are deformed or cut due to thermal deformation of the tab hangers when subjected to a heat cycle test.

SUMMARY OF THE INVENTION

It is an object of this invention to provide a package to include semiconductors overcoming the defects mentioned above and excellent in heat dissipation and reliability without causing deformation or cutting of wires.

This invention provides a package comprising a pair of flat moldings made from a thermoplastic resin and having a cavity to hold a body of semiconductor which is mounted on a lead frame, and said moldings inserting lead frames therebetween and integrally joined by melting with heating, characterized in that one of the flat moldings has in the cavity a projection which is welded to a tab of the lead frame by melt heating.

DESCRIPTION OF THE PREFERRED EMBODIMENTS

Figure 1:
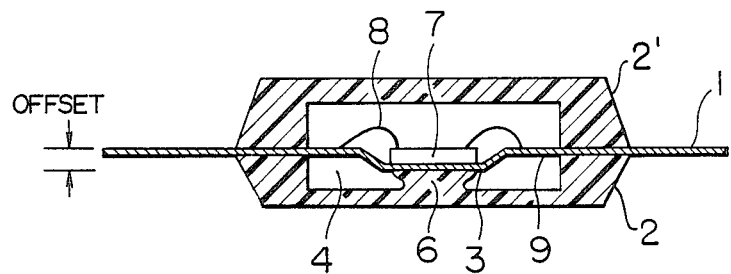
FIG. 1 is a cross-sectional view of a package including a semiconductor according to this invention.

This invention is illustrated by referring to the drawings.

Figure 2A:
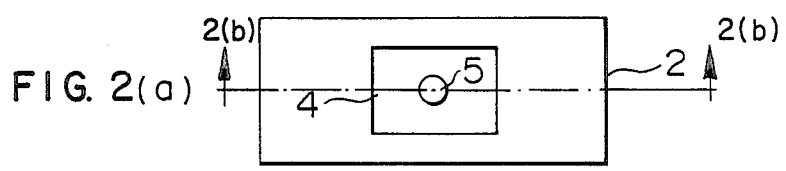
FIG. 2(a) is a plan view of a flat molding and FIG. 2(b) is a cross-sectional view of the flat molding.
Figure 2B:
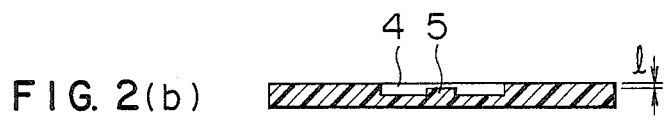

FIG. 2 shows a flat molding 2 used in this invention having a cavity 4 in the central portion for holding a semiconductor and a projection 5 in the cavity 4. The number, size, shape and position of projection are decided depending on the size of lead frame tab. For example, the size of projection is 20 to 100% of the tab area in order to attain the object. The shape of projection may be a cylinder or a square pillar. The top of projection is preferably in a round form rather than flat in order to attain uniform adhesion. The projection is preferably formed approximately at the center of the tab. The above explanation is the case of one projection, but when a plurality of projections are formed to support the tab, the projections preferably have a total cross-sectional area of 20% or more of the tab area. The number of projections is not limited but is usually 4 to 6.

The depth 1 is decided depending on the offset amount of the tab. The term "offset" means a difference of the heights of the surface of tab and the surface of lead frame as shown in FIG. 1. Usually, the depth 1 is in the range of 0 to 400 μm.

FIG. 1 is a cross-sectional view of a package including a semiconductor formed by using such a flat molding 2 and integrally joining lead frames mounting a semiconductor with flat moldings (2,2') from a thermoplastic resin. The projection 5 present in the cavity 4 for holding the semiconductor in the flat molding 2 shown in FIG. 2 at the time of integral joining under pressure is welded to a tab 3 of lead frame shown in FIG. 3 by melting a part of the resin of the projection after the integral joining under pressure.

Therefore, the heat dissipation becomes better since the projection 6 is welded to the tab 3 as shown in FIG. 1. Further, no deformation is given to the tab so as to cause the deformation or cutting of the wires, since a part of the melt softened resin of the projection is welded to the tab at the time of integral joining under pressure. In addition, since the tab is also supported by the welded projection 6 after the integral joining under pressure, the defect of deformation or cutting of the wire 8 due to the thermal deformation of the tab hanger 9 shown in FIG. 1 during the heat cycle test can be solved, which results in improving the reliability of package.

Any apparatus can be used in this invention for integrally joining heated flat moldings made from a thermoplastic resin and lead frames inserted therebetween.

As the thermoplastic resin for forming the flat moldings, there can be used various kinds of thermoplastic resins depending on requirements for individual semiconductor packages. But the thermoplastic resins should have high thermal resistance (including resistance to heat distortion and resistance to thermal degradation), low moisture permeability and electrical and mechanical properties as well as good moldability.

Typical examples of the thermoplastic resin are polyphenylene oxides, polyether sulfones, polysulfones, phenoxy resins, polyacetals, polyethylene terephthalates, polybutylene terephthalates, polyarylates, polycarbonates, polyamide resins having a low moisture absorption, polyphenylene sulfides, blends of these resins with one or more fillers such as glass fibers, etc.

The package including a semiconductor of this invention can be produced by heating joining surfaces of flat moldings made from a thermoplastic resin, one of the flat moldings having a projection in the cavity, at a temperature of 200° to 500° C., inserting preheated lead frames mounting a semiconductor so as to contact a tab of the lead frame with the projection, and integrally joining the flat moldings and the lead frames with heating at a temperature of 200° to 500° C. under a pressure of 10 to 50 kg/cm² for 3 to 10 seconds. In such a case, the tab is preferably heated, but may not be heated so long as the welding between the tab and the projection can be attained. The above-mentioned pressure conditions are for the total of moldings and the tab only contacts with a molten top of the projection. As the heating method, there is no particular limitation thereto. The whole surfaces of moldings are, for example, preheated by hot-air and the lead frame is preheated, for example by a heating plate.

This invention is illustrated by way of the following Examples.

Example 1

Figure 3:
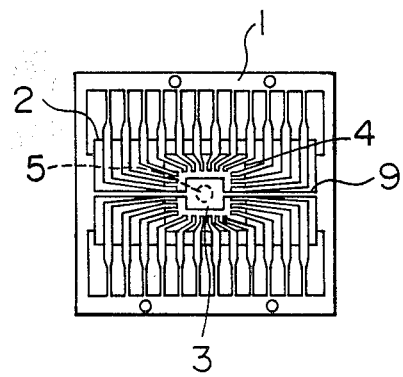
FIG. 3 is a plan view of one constituting unit of a lead frame.

A flat molding (14×32 mm square) having a cavity in the central portion and a cylindrical projection with a diameter of 3 mm and a depth (l) of 120 μm in the cavity as shown in FIG. 2 was produced by using polyphenylene sulfide resin having a heat distortion temperature of 260° C. or higher. A flat molding having only a cavity was also produced by using the same resin as mentioned above. Joining surfaces of the flat moldings were heated at 300° C. in a molding machine and a preheated lead frame, which had a tab of 4 mm×4 mm square and 300 μm in the offset amount, mounting a semiconductor and 5 series of constituting units with 24 pins as shown in FIG. 3 was inserted between the flat moldings, followed by integral joining under a pressure of 25 kg/cm$^2$ for 5 seconds with heating at 300° C. to give a package as shown in FIG. 1.

The thermal resistance at the integral circuit (IC) joining portion after the integral joining under pressure was 100° C./W, which value was 30% or more lower than the case having no projection in the cavity of flat molding. This fact can remarkably contribute to the prolongation of the life of semiconductors having particularly larger capacity.

When the wires were observed by using a microscope after the integral joining under pressure, no deformation nor cutting of wires was detected at all due to the welding of a part of the resin of the projection to the tab.

No deformation nor cutting of the wires was admitted due to thermal deformation of the tab after the heat cycle test under conditions of at −65° C. for 30 minutes/+150° C. for 30 minutes with 500 cycles and sealing properties were also good.

Comparative Example 1

The process of Example 1 was repeated except for using flat moldings having no projection in the cavity for holding the semiconductor. The thermal resistance at the IC joining poriton was as large as 150° C./W. After the heat cycle test, some of the nail head portions of the wires were peeled off due to the thermal deformation of tab when observed by using a microscope, since the rear side of the tab was not supported by a projection of a flat molding.

Comparative Example 2

The process of Comparative Example 1 was repeated except that a cylindrical metal having a diameter of 3 mm and l=120 μm was inserted between the cavity surface of base flat molding and the rear side of the tab. After the integral joining under pressure, it was admitted by a microscope that the wires were deformed or cut due to the deformation of tab caused by the inserted metal piece.

As explained above, according to this invention, since the tab of lead frame is welded to a part of the resin of the projection formed in the cavity of one of flat moldings at the time of melt softening of the resin, the wires are not deformed nor cut and the resulting package including a semiconductor is excellent in heat dissipation and reliability.

What is claimed is:

1. A package comprising a pair of flat moldings made from thermoplastic resin and defining a cavity to hold a body of a semiconductor which is mounted on a lead frame inserted between said moldings, contacting surfaces of said moldings being integrally joined together by heat melting, the improvement wherein one of the flat moldings has in the cavity a projection of thermoplastic resin which is heat welded to a tab of the lead frame underlying said semiconductor body.

2. A package according to claim 1, wherein the projection is integrally molded to said one flat molding.

3. A process for producing a package including a body of a semiconductor which comprises heat joining surfaces of flat moldings that are made from thermoplastic resin and that define a cavity to hold a body of a semiconductor, one of the flat moldings having a projection in the cavity, inserting a preheated lead frame mounting the body of the semiconductor between the flat moldings to contact a rear side of a tab of the lead frame beneath the semiconductor body with the projection, and joining integrally the flat moldings and the lead frame by heat melting to weld the rear side of tab to the projection.

* * * * *